Oct. 24, 1967 R. J. CALLENDER 3,349,171

I.F. BAND PASS STRUCTURE

Filed Oct. 15, 1962

INVENTOR.
RUSSELL J. CALLENDER
BY
Alton V. Oberholtzer

United States Patent Office 3,349,171
Patented Oct. 24, 1967

3,349,171

I.F. BAND PASS STRUCTURE

Russell J. Callender, 115 Wildwood Beach Road, Mahtomedi, Minn. 55715

Filed Oct. 15, 1962, Ser. No. 230,322
9 Claims. (Cl. 178—5.8)

Figures 1, 2:
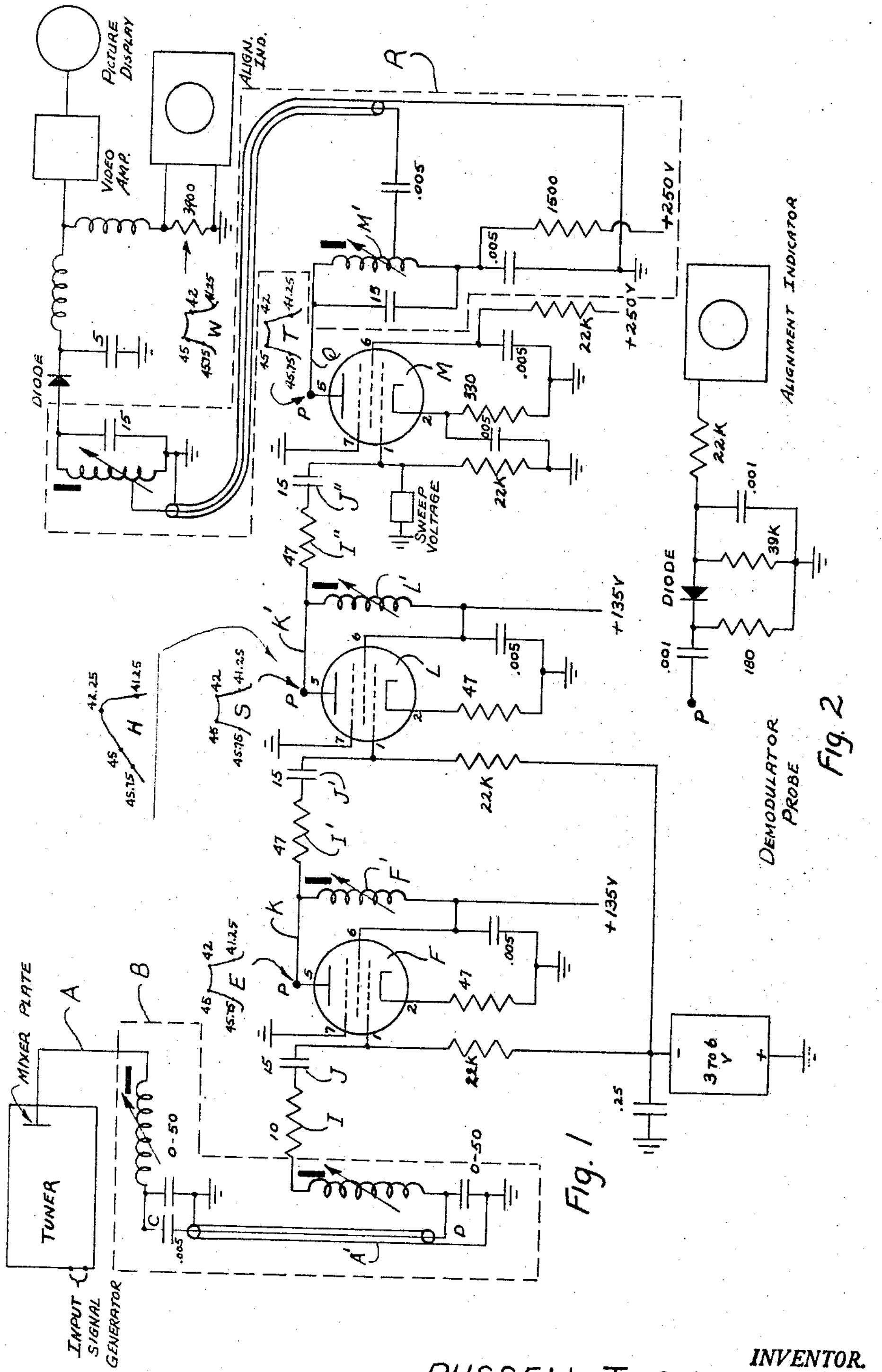

This invention relates to an improvement in band pass control structure and the method of controlling band pass width range with control of the rise and fall time of modulated carrier components for a sharp picture display with elimination of sound interference in the picture display and complete elimination of attenuating circuits while large passage of band width is utilized and accomplishes sharp cut off of frequency range at sound modulated carrier frequency. More particularly, the invention relates to an improved arrangement of a transmission line transformer series resonant structure with a characteristic frequency band width range of small frequency range in its slopes and large frequency range at the maximum amplitude of its resultant response curve.

More specifically, the transmission line transformer arrangement, as exemplified herein, is in combination with an interstage network having a coil in the plate circuit and with a resistor and coupling condenser in series connected to the plate and the following grid of the interstage network. Hereby the coil resonant frequency is governed by the grid and plate capacitance of the said interstage network. The characteristic band width range of the interstage network is thereby controlled and governed by the non-reactive resistor in series with the said grid capacitance governing the said resonant frequency. As herein illustrated and exemplified, this arrangement has most of its characteristic frequency range in the slopes of its resultant response curve. The following description compares the prior art and illustrates the employment of a network utilizing my new structural arrangement in a picture strip I.F. of television equipment including my new method of alignment of respective series circuit stages which constitute a cascade structure. As described herein, the series circuit stages are each tuned to a common frequency range to accomplish the elimination of depreciation of carriers modulated components.

The art, in the utilization of broad band high frequency devices, such as in an I.F. picture strip, has approached the widening of the frequency band width of equipment to obtain quality of reproduction, by employment of staggered tuned stages of an amplifier, by the employment of loading resistors across the coils of the system, and by over-coupling the circuits between each stage and a combination of the indicated means. However, adequate band width does not necessarily obtain quality reproduction. In the case of resistors across coils of a system, the regulation of the Q of a system can accomplish band width, but the system's frequency cut-off is not good allowing frequency band pass at a low amplitude adjacent to the desired band width as well as producing a rounding of the leading and trailing edges of components of a modulated carrier in its passage through the system. The employment of trap circuits to decrease the frequency range of the slopes of the response curve of such systems introduces standing wave reproduction at the demodulator output load resistor and provides a complicated procedure to accomplish alignment of the system. In the case of staggered tuning stages of a system to accomplish band width, the modulated components of the carrier have a high degree of phase shift in their passage through the system, if tuning is deviated greatly, as well as poor gain per stage for the carrier, but a high Q can be indicated in the response curve of such a system.

Over-coupling the stages, by transformers interstage, and stagger tuning each stage to overcome the over-coupling factor has accomplished a good combination in the art. Although, by comparison, poor quality of picture detail is evident as well as low gain per stage when this method is used in television equipment. While stagger tuning is also far from ideal, phase shift of some modulated components of the picture carrier is tolerated.

In all the systems so far indicated, the position of the carrier along the slope for each method is somewhat critical, in relation to low frequency modulated components of a picture carrier, as well as intermediate high frequency components, of the carrier producing phase shift in the picture display. To avoid phase shift of modulated components of picture carrier in single side band transmission has resulted in tricky alignment of the picture strip. It will thus be apparent that there is need for providing improvement and simplification of band pass control.

Accordingly, an object of this invention is to provide a structure to obtain a band width of frequency in a band pass filter system in which each stage of the amplifier produces an equal frequency movement simultaneously at the low and high frequency slopes of each stage's resultant response curve, and thereby the overall response curve is not a stagger tuning of the amplifier's individual stages, to obtain wide band width range with a characteristic band width for each stage.

Another object of this invention is to provide a system in which the leading edge and trailing edge of a carrier's modulated components are not altered in their passage through the system.

An additional object of this invention is to provide a system in which the carrier's modulated components in its passage through the amplifier of the system's band pass filter is free of image response or of a standing wave response at the demodulated output of the band pass structure.

It is a further and particular object of this invention to provide a system and structure in which the resultant frequency response curve is of a high order of Q and the system does not employ conventional attenuating trap circuits either for sound attenuation or attenuating trap circuits for placement of a picture carrier along the slope in its employment in single side band reception of television signals and the picture display does not indicate sound bar interference, nor does the system respond to adjacent channel interference.

A further object of this invention is to provide for positioning the picture carrier in a non-critical relation with reference to amplitude position.

A further object of the invention is to establish an input stage with a characteristic frequency response of a structure with sharp cut-off of frequency range and with the stage's structure response curve having large frequency range at the highest amplitude and of equal amplitude and to follow said stage with stages of tuning structures that their individual response curves do not change the characteristic response curve of in-put stage but increase amplitude of in-put stage's characteristic band width.

Further objects and advantages will be more clearly apparent from the following explanation and description relative to the drawings wherein:

FIGURE 1 is a schematic illustration of a circuit arrangement embodied in this disclosure including response curves illustrative of response curve results of each illustrated stage and response curves of the overall results of the combined plurality of stages; and FIGURE 2 illustrates a demodulator probe system of conventional structure with screen indicator whereon the curve alignments of FIGURE 1 are illustratively synchronized for each plate circuit when connected to P points respectively.

Inasmuch as the indicated circuits are self-illustrative of known elements denoted by conventional and known designations for the separate parts those skilled in the art will have no problem in reading applicant's modified arrangement of a conventional cicuit arrangement without trap circuits, from the in-put tuner mixer plate to the picture display and video amplifier as shown in FIGURE 1.

From the mixer plate the received signals are transmitted by conductor A through a band pass filter transmission line and coils. The transmission line coil arrangement B consists of two series resonant circuits C and D, as illustrated. The transmission line A' is inserted across the series resonant condensers of the resonant circuits C and D. The behavior of transmission line coil arrangement B creates a band pass frequency range controlled by a ratio of inductance of the coils to the value of the series condenser with the frequency band pass inversely proportioned to the condenser's electrical value. The response curve E in FIGURE 1 at point P of tube F is a typical curve for the structure indicated with the sweep voltage applied to input of tuner of FIGURE 1. For example, this response curve is an electrical phenomena or pattern produced on a screen as by the type of demodulator probe illustrated in FIGURE 2, or otherwise such conventional electrical equipment as is well known to the art of such instrumentation for response curve readings. As herein exemplified, to effect the response curve E of FIGURE 1, for the structures C and D, a designed pair of high inductive coils of filter B are aligned to resonate with their series capacitors and the reactance at both ends of the transmission line to a desired frequency range of, for example, 45 megacycles to 42 megacycles, as illustrated. That is, to accomplish the alignment, structures C and D are aligned to the smallest band width range governed by the capacitive reactance of the series condensers. This is called the characteristic band pass. The band width markers 45 mc. and 42 mc. are at the maximum amplitude of the response curve pattern E and the range of frequencies between 45 mc. to 42 mc. behave as resonant frequencies; with the grid 1 of tube F coupled to filter B through a non-reactive resistor I, and coupling condenser J of additional stages, as structures F', I', J' and C and D of FIGURE 1. A suitable sweep voltage as of 40 to 50 mc. as herein described and known to the art, is provided through structures C and D of filter B and through the structures F', I' and J' to point P of stage L, where the alignment indicator is connected, as described. The filter structure B, as herein described, is aligned for its narrowest band width, controlled by choice of the series capacitive reactance of circuits C and D, to a resonant frequency of 45 to 42 mc., as illustrated, for pattern E. The structures F', I', J' is aligned by adjusting the core of coil F' to resonance with the plate capacity, and with a non-reactive resistor in series with the following grid capacity, to the 45 to 42 mc. band width range. The resultant response curve pattern S at point P of stage L is achieved. The resultant response curve pattern S is observed on the screen of the indicator and adjustable by the physical movement of the tuning core of coil F', as exemplified in the drawings. As hereinafter indicated, when both slopes of the curve pattern simultaneously indicate frequency movement in amplitude or frequency range, the alignment is precisely obtained.

The response curve E has large frequency range at the maximum amplitude and forms the overall curve at point P of tube L even if the actual response curve at point P of L is as indicated in H because the alignment indicator only reproduces the narrowest frequency range of the transmission line transformer structure B above described. The system B is preferably used to establish a characteristic band width. The two coils with series condensers form two resonant circuits C and D which are connected by a transmission line similar to that disclosed in my issued Patent No. 2,946,847. Herein, the ratio of inductance to capacitance is different in the series circuit arrangement shown, with the condensers of approximately 0 to 30 mmfd.

Response curve H of structures F', I', J' or other stage structures L', I'' and J'' of L is of such magnitude in band width that response curve of structure B is the overall response curve of the system at point P of F and L with amplitude progressively larger at point P of F and L. In FIGURE 1 response curve H is illustrative as to band width relationship only and its indicated resonant frequency is approximately 42.25 mc. Therefore, the tuning inductor would have to be adjusted to bring the resonant frequency of H to coincide with structure B's resonant frequency.

From the transmission assembly B, the signals are transmitted through the herein modified structure of series-connected non-reactive resistor I of about 10 ohms resistance and resonant condenser J of about 15 mmfd. and pass into receiver tube F of conventional character, for example, a 6BZ6. The resistor I of about 10 ohms, controls the decoupling factor of response curve E of tube F at its point P. On omission of I, a flat curve can be obtained by regulating the ratio of C and D. This obtains critical coupling for structure B and produces all frequency range at same amplitude and small frequency range in the slopes of response curve of structure B. The detail of tube circuit is otherwise conventional as is known to those skilled in the art and includes conventional signal inlet 1, grounded circuits 2 and 6, ground 7 and plate circuit 5. The invention eliminates shielding, thereby economy in manufacture over conventional equipments.

From tube F the signals are transmitted by conductor K through non-reactive resistor I' of about 47 ohms and through resonant condenser J' of about 15 mmfd., into second stage tube L, for example, a 6BZ6 of conventional design and circuit arrangement, as indicated for tube F. The plate circuit of F has a tunable inductor F'.

From tube L the signals are transmitted through conductor K', another non-reactive series resistor I'' of about 47 ohms and series resonant condenser J'' of about 15 mmfd., into tube stage M, for example, a 6CB6 tube of conventional design and circuit arrangement as provided for tubes F and L, as indicated. The signals from tube M, for example, are transmitted by conductor Q into band pass filter R.

While it will be recognized that additional receiver stage circuits may be provided with a similar arrangement of series resistor and condenser feed-in, or in the alternative a like condenser and resistor series in reverse order, from the signal source to reproduce the response curve, as illustrated at S and H, and in the manner indicated relative to tube F. This three stage system is amply illustrative of several unexpected and surprising results that have been obtained. The operation and results will be explained in conjunction with utilizing the additional band pass filter system R as described in my Patent No. 2,946,847, connected through the diode to conventional video and picture display output circuits, as schematically illustrated. The response curve T of tube M is reproduced in the manner of response curves E and S. The plate circuit of L has a tunable inductor L' and plate circuit of M, the tunable inductor M' in the band pass filter system R.

As herein illustrated and described it will be recognized that response curve T shows further alignment of the frequency range is accomplished relative to the input, by C and D, to correspond with patterns E and S. The following stage structures L', I'' and J'' are connected to the grid of tube M, as described, and the response curve T is obtained by applying a sweep voltage of 40 to 50 mc. and connecting the alignment indicator to point P of stage M and a siutable ground, as described. By adjustment of tuning core of coil L', to produce a resultant amplitude or frequency movement simultaneously on both slopes of pattern T, the resultant response curve shows a common frequency range with each preceding stage. By accomplishment of this alignment there is obtained an alignment of frequency range of each stage's structure, with maximum amplitudes, and with all components of the carrier in phase, as hereinafter explained and illustrated with respect to the overall response and resultant frequency range.

In order to more clearly explain this invention or improvement, there is thus provided a receiver system in which the band pass structure has a characteristic band width of frequency for each stage and where the stage's individual response curves are tuned to coincide at the same resonant frequency. The output stage circuit characteristic response curve W has a slightly less frequency band width range so that the carriers of a television transmitted signal, in its passage through the system (the said output stages characteristic band width), is the determinate for the carriers' amplitude position on the slope. In addition, said output stage characteristic band width is adjusted in frequency range width so that its resultant response curve regulates the amplitude position of the sound carrier as well as the picture carrier to obtain a mixing of these two carriers without mutual interference. The band pass response curve of said output stage is adjusted, by inserting the sweep voltage on control grid pin 1 of the tube M with the proper frequency range consistent with the preceding stages, to a narrower frequency range to insure its being the slope the picture carrier is placed on as well as extending the picture carrier amplitude position down the response curve, while the characteristic frequency response of the preceding stages E, S and T relatively increase the amplitude of the picture carrier and are tuned to a common resonant frequency.

The accomplishment of this system results in improved sound output with no sound bars in the picture display. The received signals are free from picture interference in sound output with an improvement in picture quality that is free from sound interference. By having the preceding stage characteristic response range greater in frequency band width range than the output stage's characteristic band width, the output stage is the determinate as to where the picture carrier amplitude position is along the slope. Thus, phase shift is avoided and the rounding off of the leading and trailing edges of the picture information, as measured in the picture display, is eliminated. In general, it has been discovered that this combination avoids stagger tuning by obtaining a characteristic band width for each stage, as at E, S and T, tuned to the same common resonant frequency and the output stage plate circuit band width is accomplished by the capacitive reactance across two tap coils in ratio to the inductive reactance across the line controls band width of the output stage of FIGURE 1. By adjusting the slightly less frequency range of the plate circuit's characteristic band pass, the said plate circuit band width response curve is adjusted slightly less in frequency band pass. In addition, by having the band pass control across the line in the output tap coil of R of FIGURE 1 greater, or conversely having the band pass control on the input tap coil less, the improvements herein can be accomplished.

It is understood that the tuning of the stages will be accomplished as indicated and that the highest amplitude for each stage's characteristic band width response curve will be performed; and the equal frequency movement simultaneously at both slope sides of the individual response curve with equal amplitude for both slopes respectively as indicated in the said resultant response curve respectively is obtained in the alignment process. The tuner being consistent with the picture strip frequency range allowing picture carrier and sound carrier of substantially equal amplitudes in all resonant tuning circuits of the tuner, in a non-staggered tuning relationship.

If an alternate conventional output circuit is employed in the invention, the individual characteristic response curve of the structure making up the output circuit must have its frequency range coinciding with the frequency range of the preceding structure's characteristic response frequency range. However, the frequency range may not be adequate to accomplish the best sound output or that sound bars may appear in the output. Further, while the trap circuit is eliminated, this does not fully accomplish the control of rounding the leading and trailing edges of the picture information due to stagger tuned stages one might encounter, or poor cut off of conventional circuit stages.

In the preferred arrangement for obtaining the characteristic band width for each stage with elimination of all conventional trap circuits, I can now provide clear cut leading and trailing edges of modulated components of a picture carrier display free from ringing or standing wave reproduction at the demodulator's load resistor, control over-coupling in each of the stages, eliminate sound bar interference in the picture display, and eliminate picture interference in the sound output. This improved circuit arrangement provides for tuning of the output stage to accomplish mixing of picture and sound carrier to obtain clear picture and sound output upon elimination of all conventional trap circuits and each stage tuned so that their respective response curves are aligned to have a common respective resonant frequency coincide throughout. The term "characteristic response curve" means the smallest frequency range a stage or structure can be tuned to.

It is to be understood that the essential features of this discovery are concerned primarily with the circuitry affording the reproduction of subcarrier components of color signals where adequate band width is obtained and all modulated components of transmitted signal are reproduced free from any depreciation for an amplifier stage and preferably a series of such stages as exemplified by F, L and M and any order of stage can be instituted, Q regulated first and transmission line transformer structure in any order. However, the overall system, as described, is the preferred arrangement for the overall control features and method which is herein described with respect to the response curve characteristics of each stage and the overall resultant response curve. While the system is adaptable to any channel range frequency of sound and picture transmission, the illustrated response curves E, S and T and W of each stage are described with respect to the resultant overall effect shown in curves H and W of the presently used channel frequencies.

In this relationship, each stage response curve, for F, L and M is individually adjusted by individual means and connected with the demodulator probe at the respective points P and a suitable ground with care that the common resonant frequency coincides. The alignment indicator will then reproduce the illustrating resultant response curve as indicated. The input transmission line transformer has an insulating blocking condenser in series with transmission line.

For example, the first, second and third stages of the illustrated arrangement is for a picture strip I.F. of television equipment which is otherwise of conventional circuitry arrangement but without the trap circuits and the resistors I, I′ and I″ as described. Additionally resistors I, I′ and I″ are utilized to decouple the stages so that the respective response curves do not indicate over-coupling and the ratio of the non-reactive resistor's value to the capacitive reactive value of the coupling condenser controls the Q of the coupling condenser and with the plate circuit inductor forms a tuning device in which the respective response curve's characteristic band width is adjusted so the resonant frequency of said structure response curve coincides with all the other stages of the system. The respective resistor I′ with condenser J′ and the preceding plate circuit inductor forms a structure which has a characteristic band width range depending upon the regulation of the Q of the condenser J′ by the resistor I′ for example with its said characteristic band width range tuned so the resonant frequency of the said band width range coincides with resonant frequency of the transmission line transformer structure illustrated in the mixer plate arrangement illustration.

It will thus be recognized that I have herein provided a TV wide band pass system, wherein the response curves of all stages are aligned to coincide at the resonant frequency of each stage to a common resonant frequency with no involved reactance. With each stage preadjusted to a common resonance there is obtained frequency reproduction with no time lag or depreciation of components. While it will be apparent that alternatively a conventional input structure and/or output structure may be utilized, with the described resistor and condenser system in the amplifier stages, as described, the preferred overall arrangement is with an input and an output structure of the character shown and described.

The coupling condensers are as illustrated in FIGURE 1 N.P.O. ceramic type.

The band width structure of transmission line and series resonant condensers and inductors can be referred to as a transmission line transformer and the said transformer has a ratio of inductive reactance of the coils to the said series resonant condensers to obtain the large frequency bandwidth at the highest amplitude of structure B of FIGURE 1 with small frequency range in the slopes of structure B, thus the behavior of sound carrier's components can be eliminated in the picture display as well as controlling the rounding off of leading and trailing edges of picture carrier components by having all stages at a common resonant frequency throughout.

The coils of structure B of FIGURE 1 must not have a high distributing capacity or external capacity across the said coils because the behavior of the ratio would be impaired, nor loading the said coils with resistors to regulate the Q. The stages illustrated in FIGURE 1 have no shielding throughout and are very stable in operation.

There is herewith provided an improved arrangement of a series resonant circuit structure for regulating the frequency range of the band pass and providing an improved method of coinciding and regulating capacitor reactance in resonant frequencies to obtain a wide relatively flat response curve with each stage. The rise and fall of the demodulated components of the picture carrier are controlled by the method of corresponding aligning band width in each stage and the resonant frequency of each stage structure is made to coincide at a common resonant frequency of numerical value. That is, the system described provides for a method of coinciding the resonant frequency of each stage to a common resonant frequency, in a non-staggered relationship and where no traps and no reactance is involved, and the intermediate stages are aligned resistively by turnable inductors to pass the selective band width of the picture carrier and sound carrier through a common resonance of each amplifier stage in reproduced relationship with no time lag or depressions of components. As indicated, the tuner being consistent with aligning each stage resistively in the applied series resonant circuits and coinciding the resonant frequency of each stage, as represented by the indicated response curves in the intermediate stage frequencies. Thus the system provides for simplicity in manufacture and field alignment without the heretofore required fine tuning with special shop equipment. The invention makes it possible to eliminate shielding in a system, thereby effecting great economy in manufacture.

It will accordingly be recognized that I have made it possible to provide close alignment of definite resonant frequency range at the highest amplitude of each stage tuning with aligned stages of the same resonant frequency and equal wide band transmission without trap circuits or stagger tuning.

The invention greatly improves the leading and trailing edge of the synchronizing pulses when applied to television equipment, and in this connection, the vertical hold and interlace are of superior caliber.

It will further be recognized that while I have shown and described the preferred embodiment of my new structure and method, some modifications and alterations are possible, as will now be recognized by those skilled in the art, without departing from the true scope of this improvement in the art as defined in the appended claims.

I claim:

1. In a broad band pass structure of an I.F. picture strip with picture and sound modulated carriers translated through the said strip, the arrangement comprising an input coil, a series condenser means connected to said input coil, an output coil, a series condenser means connected to said output coil, a transmission line connecting across said first series condenser means to across said output coil's series condenser means, and circuit means connecting the said output coil to an amplification stage of a television circuit; whereby the characteristic band pass range of the said I.F. picture strip is determined by the ratio of inductive reactance of said coils to the capacitance of said series condensers and the amplitude position of each carrier is regulated and controlled by the band pass width of the characteristic band pass response range of said arrangement.

2. A band pass system for reception and translaiton of an I.F. picture carrier with insertion of modulated carrier means and having an input stage, a series of amplifier stages, and an output stage; each said stage having a characteristic broad band pass frequency range and all stages are independently aligned at a controlled same common exact characteristic broad band frequency range in the series stages at the said same common broad band pass frequency which is each stage's broad band frequency range, and said insertion of modulated carrier means comprising an input means for picture and sound modulated carrier components insertion where all of said stages have a characteristic broad band pass range of such magnitude in band width range that the narrowest characteristic broad band pass range of any stage in the said system becomes the overall frequency response range of the system and thereby the picture carrier amplitude position is placed halfway down the high frequency side of said narrow band width stage whereby the rise and fall time of all the components of the picture carrier, when demodulated, is not changed.

3. A broad band pass structure for a television circuit having an input stage, a plurality of amplifier stages, and an output amplifier stage for translation of modulated carrier signals, said input stage being tuned to provide a charactertistic wide band pass frequency range for each of said amplifiers in said plurality of amplifier stages and being independently adjusted to the same coinciding characteristic wide band pass frequency range and coinciding in frequency range with said input stage, said output stage being adjusted in frequency range width to obtain a narrower frequency band width range of the said same common coinciding and characteristic frequency range established by said input stage and said plurality of amplifier stages; whereby, the rise and fall time of said modulated carrier signals, when demodulated, is not changed.

4. A broad band pass frequency determining system comprising: an input circuit, said input circuit including; a first inductance coil and a first series condenser; an output circuit, said output circuit including; a second inductance coil and a second series condenser, said input circuit and said output circuit being interconnected by a transmission line, one end of said transmission line being connected across the first series condenser of said input circuit and the other end of said transmission line being connected across the second series condenser of said output circuit, said input circuit and said output circuit having a common frequency range alignment at maximum amplitude frequency response band pass ranges; whereby the characteristic band pass frequency range of said system is controlled by the ratio of inductance reactance of said first and said second inductance coils and the capacitance reactance of said first and said second series condensers, and the band pass frequency range of said system being inversely proportional to the capacitance value of said first and said second series condensers.

5. The structure of claim 4 in a television circuitry system containing an amplifier system having multiple stages of interconnected plate and grid means including a tuned interstage network filter spectrum frequency determining structure interconnecting a plate and grid of the amplifier system comprising an arrangement in which the plate of one amplifier stage and grid of the following amplifier stage are connected through a coupling capacitor and a non-reactive resistance connected in series between the respective plate and following grid and including a tuning coil connected to said plate and said series coupling capacitor and resistance; whereby said tuning coil resonates with the plate capacitance and the following grid capacitance modified by said resistance and coupling capacitance and the ratio of said resistance and grid capacitance modified by said coupling capacitance determines the characteristic band pass spectrum frequency range of said tuned interstage network filter structure.

6. The structure of claim 4 in which the said input circuit and said output circuit have an exact common spectrum frequency band pass range at their maximum amplitude frequency response range, and the resultant frequency response band pass range has a sharp frequency cutoff characteristic of the said structure's spectrum frequency.

7. In a television spectrum frequency determining circuit system having a plurality of successively coupled broad band pass amplifier stages with said stages therein being provided with a plate circuit coupled to a following grid circuit for translation of I.F. picture carrier and sound carrier components and the said coupling comprises a tunable inductor connected to a said plate of a said amplifier in combination with a coupling capacitance means and non-reactive resistance means, said resistance means and coupling capacitance means being connected in series in the said plate to a following stage grid circuit; whereby, each stage when aligned in frequency band pass range at the same common frequency range spectrum frequency range at its maximum amplitude frequency response ranges is of at least the full portion of the narrowest band pass spectrum range of any said stage of the said television circuit system and the resultant common shared frequency range is regulated and controlled in each said stage by each said resistance and coupling capacitance and tunable inductance respectively.

8. The structure of claim 7 wherein the amplifier stages are in a cascade system of at least three stages and each stage is provided with a single-tuned interstage coupling network comprising a tunable inductor coil connected to said plate, and a resistance connected in series with a grid coupling capacitor in the plate to following grid circuit for the next amplifier stage; whereby the spectrum band pass frequency range in each stage is independently controlled by a said coil and the ratio of the said resistance to the said grid coupling condenser for each said respective interstage network, and each of said amplifier stages can be aligned in frequency range at the exact same common spectrum frequency range at their maximum amplitude frequency response ranges of at least the full portion of the narrowest band pass spectrum range of any stage of said amplifier stages.

9. In spectrum frequency determining broad band pass amplifier system of interconnected circuits of a television system having an input stage electrically connected through a plurality of intermediate amplifier stages to an output amplifier stage for translation of modulated carrier signals, the structure consisting of insertion means for said modulated carrier signals, translation means for said modulated carrier signals, in which said input stages frequency range has a spectrum band pass range of frequency with a sharp cutoff of frequency band pass range and said input stage has at least the full portion of the narrowest band pass spectrum range of any said stage of the said broad band pass amplifier system stages consisting of a plurality of connected amplifier stages with varient larger and same band pass frequency spectrum ranges, and which is followed by a sharp cutoff band pass frequency range output stage with the same common spectrum range with varient and same band pass frequency range as said input stage, and where all said varient and same band pass range of said stages have the same common spectrum frequency range at their maximum amplitude frequency response band pass ranges of at least the full portion of the narrowest spectrum band pass range of any said stage of the said broad band pass amplifier system; wherein with said modulated carrier inserted approximately one half way down the said amplifier system response surve slope of the resultant frequency response of said amplifier system, the said translation of said modulated carrier through the said broad band pass amplifier system of the said stages, the rise and fall time of said modulated carrier signals, when demodulated, is not changed.

References Cited

UNITED STATES PATENTS

| | | | |
|---|---|---|---|
| 2,075,181 | 3/1937 | Curtis | 325—489 |
| 2,946,847 | 7/1960 | Callender | 178—5.8 |

OTHER REFERENCES

Fink, D. G., Television Engineering Handbook, N.Y., McGraw-Hill, 1957. TK 6642 F5 (pp. 12–14 to 12–28 relied on).

JOHN W. CALDWELL, *Acting Primary Examiner.*

DAVID G. REDINBAUGH, *Examiner.*

J. A. O'BRIEN, R. L. RICHARDSON, *Assistant Examiners.*